United States Patent [19]

Takeuchi et al.

[11] 4,408,326
[45] Oct. 4, 1983

[54] CIRCUIT FOR CORRECTING ERROR IN DIGITAL INFORMATION SIGNAL

[75] Inventors: Takashi Takeuchi, Fujisawa; Harukuni Kobari, Yokohama, both of Japan

[73] Assignees: Hitachi, Ltd.; Victor Company of Japan, Ltd., both of Tokyo, Japan

[21] Appl. No.: 305,375

[22] Filed: Sep. 24, 1981

[30] Foreign Application Priority Data

Sep. 26, 1980 [JP] Japan ............................. 55-132874

[51] Int. Cl.³ .................... G06F 11/10; H04N 5/76
[52] U.S. Cl. ..................................... 371/38; 358/314; 360/36.2; 360/38.1
[58] Field of Search ............... 371/38, 47; 360/36.1, 360/38.1, 36.2; 358/314, 320

[56] References Cited

U.S. PATENT DOCUMENTS

| 4,141,039 | 2/1979 | Yamamoto | 360/36.2 |
| 4,254,500 | 3/1981 | Brookhart | 371/38 |
| 4,287,529 | 9/1981 | Tatami et al. | 360/38.1 |
| 4,306,305 | 12/1981 | Doi et al. | 371/38 |
| 4,329,708 | 5/1982 | Yamamoto et al. | 360/38.1 |
| 4,376,291 | 3/1983 | Heitmann | 358/320 |

Primary Examiner—Charles E. Atkinson
Attorney, Agent, or Firm—Antonelli, Terry & Wands

[57] ABSTRACT

An error correcting circuit particularly for an audio equipment makes use of the so-called adjacent code correction technology and an error pointer generated by the error detection code (CRCC). The circuit comprises a counter starting to count clock pulses in response to an operation start signal, a timing signal generator for steps of correction operation, a correction operation circuit operative with the timing signal, a storage circuit for storing operation results of the correction operation circuit, a monitoring circuit for monitoring the degree of execution of the correction operation steps in the correction operation circuit, using the output of the counter and a control circuit for controlling the storage of the operation results in the storage circuit, depending upon the output of the monitoring circuit.

3 Claims, 6 Drawing Figures

CIRCUIT FOR CORRECTING ERROR IN DIGITAL INFORMATION SIGNAL

This invention relates to circuits for correcting errors in digital information signals having been subjected to errors and time-base variations in a passage through a PCM audio equipment or other systems.

Throughout the specification, the term "information signal" is intended to mean a signal which includes a plurality of digital signal trains and a sync signal in the form of recurrent sync pulses interposed between adjacent digital signal trains. The information signal having been subjected to time-base variations due to its passage through a system no longer has a constant sync signal period of sync pulse repetition period. Therefore, correction of errors produced in the digital data signal by means of adjacent code correction using error detection codes does not always yield satisfactory results. This is because of the fact that the time within the sync signal period, which is available for the error correction operation, varies and is liable to expire before the completion of all the steps of the error correction operation, as will be understood from the description later given.

An object of the invention is to provide an improved circuit for correcting errors in a digital information signal containing errors and subjected to time-base variations.

Another object of the invention is to provide an error correction circuit for a high quality PCM reproducing system, which can reduce or eliminate the generation of abnormal sound in playback with a PCM recorder by obviating erroneous correction of errors due to curtailed error correction operation caused by VTR jitter or the like.

According to the invention, the state of a counter, which is cleared by an error correction operation start signal synchronized with a sync pulse in the information signal and which provides a basic timing for the error correction operation, is decoded to determine or monitor whether or not the error correction operation started with the appearance of the error correction operation start signal has been completed at the time of the appearance of the next start signal, and the output of the result of the error correction operation is inhibited if the operation is not completed by the time of appearance of the next start signal. In such a case, the data, the correction of which is incomplete (and which remains in a storage device), is provided with an error flag, so that such correction as the previous value holding or interpolation can be made using this flag before delivering the corresponding reproduced output.

Now, the invention will be described by way of exemplified embodiments with reference to the accompanying drawings, in which.

Now, the state of art, to which the invention pertains, will be described in connection with a home-use PCM encoder/decoder for recording and reproducing audio signals on the basis of the general standard in Japan for the sake of simplicity. The system, through which the information signal passes, thus corresponds to a VTR here. The standard is announced as the Technical File STC-007 of Electronic Industries Association of Japan (EIAJ), June 1, 1979, and reported in "NIKKEI ELECTRONICS," June 20, 1979, pp. 185–200 and "DEMPA KAGAKU" (or "Electromagnetic Wave Science"), September, 1979, pp. 218–220. In the PCM signal processing system conforming to the general standard, data blocks, each of which consists of 6 interleaved sampled signal words (hereinafter referred to as information data) and two error correction words (hereinafter referred to as error correction data) P and Q, and monitored by using an error detection word (hereinafter referred to as CRC) for every horizontal scanning period in the playback with the VTR, and are transferred to a de-interleaving RAM with an error flag attached to error data. The data read out from the RAM is not directly coupled to a D-A converter but is subjected to error correction, and the results of the correction is written again in the RAM. The corrected data is thus supplied to the D-A converter.

Figure 1:
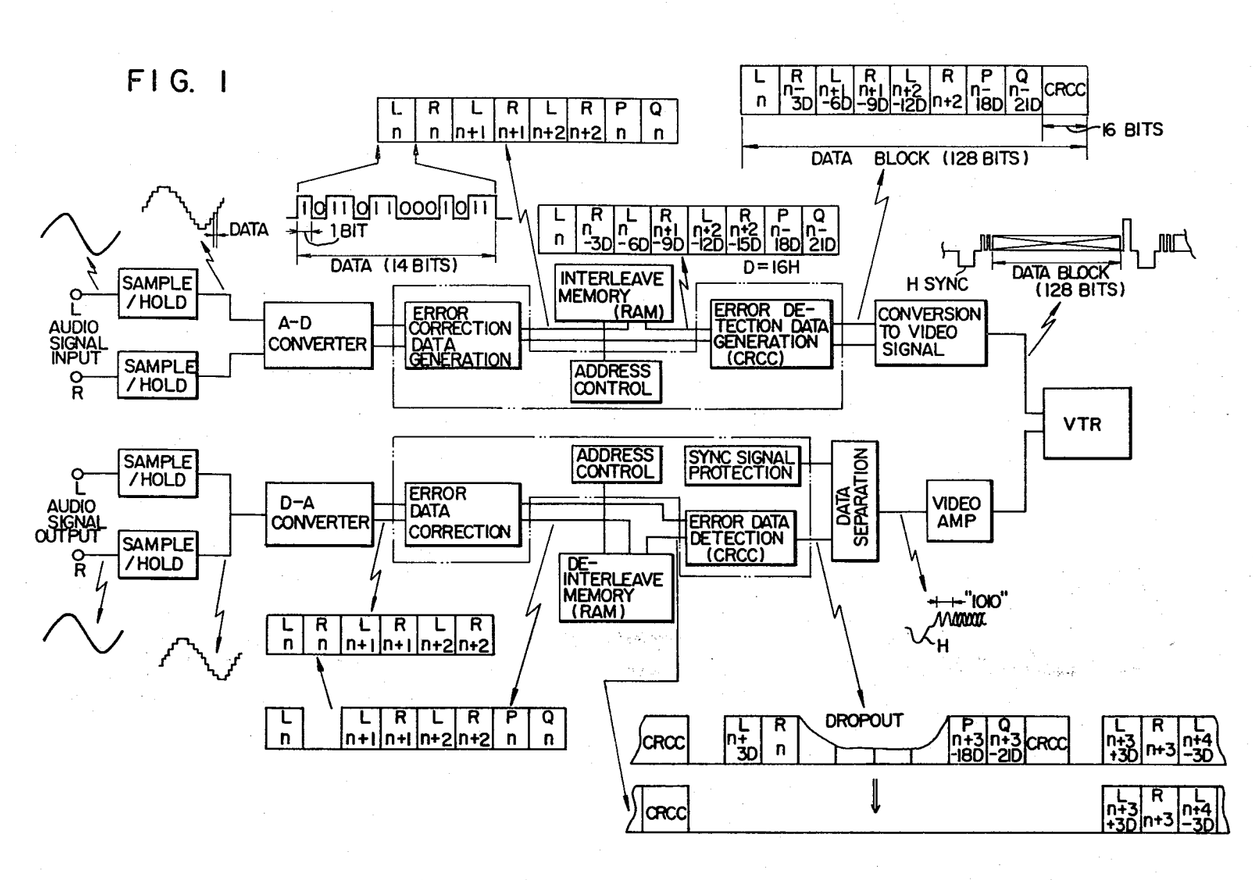
FIG. 1 is a block diagram showing a PCM recorder, to which the invention is applicable.

FIG. 1 is a block diagram of a PCM recorder. A portion enclosed by a chain line corresponds to an encoder/decoder for effecting digital signal processing. The function of the PCM recorder is roughly as follows:

(a) Sample/hold circuit, A-D converter

This portion of the recorder time-divides a two-channel (L- and R-channel) audio signal input and converts the individual signal divisions to 14-bit digital signals (words) in terms of "1" and "0". Six words (three L-channel and three R-channel signals alternately arranged) each having a 14-bit configuration constitute one block.

(b) Generation of error correction words

Error correction words P and Q are generated through exclusive ORing and matrix operation of the data of the L- and R-channel words (6 words).

(c) Recording system storage device

Continuously generated data are interleaved in a storage device in order to prevent generation of a burst error due to a large drop-out and improve the error correction efficiency.

(d) Generation of error detection words (CRCC)

Error detection words (CRCC of 16 bits) are generated from the interleaved 8-words digital signal.

(e) VTR sync signal generation and video conversion

A VTR sync signal synchronized with these digital signals is generated, and these digital signals and VTR sync signal thus generated are converted into a video signal conforming to a standard VTR signal suited for recording with the VTR.

(f) Video amplification and data separation

The video signal reproduced from the VTR is separated into the sync signal and data signal and converted to the digital signals again.

(g) Detection of error data

Error check of the reproduced data is done using the error detection words (CRCC), and error data is given an error flag for subsequent error correction.

(h) Reproducing system storage device

Converse to the recording system storage device the interleaved data are re-arranged to the original order (i.e., de-interleaved), while at the same time wows and flutters due to the VTR rotation fluctuations are absorbed and removed.

(i) Correction of error data

If the de-interleaved data is erroneous, error correction operation using the two error correction words P and Q is effected to recover the original correct data.

(j) D-A converter and sample/hold circuit

The digital signal in terms of "1" and "0" is converted to the audio signal, and also this audio signal is separated into the two-channel (L- and R-channel) signals.

In the PCM recorder shown in FIG. 1, errors occur in the information data of the reproduced signal due to dropouts caused by noise, foreign particles on and defects of the magnetic head and the magnetic surface of the magnetic tape in the recording system. To minimize the errors, an error correction circuit is provided. This error correction circuit effects error correction by making use of the error correction words.

The principle underlying the generation of the error correction words and error correction using these error correction words are described in "NIKKEI ELECTRONICS", Aug. 20, 1979, pp. 194-196, and will be summarized hereinbelow.

Denoting 6 words constituting digital information data by $w_1, w_2, \ldots, w_6$, the error correction words are generated as $$P = \sum_{k=1}^{6} w_k = w_1 \oplus w_2 \oplus w_3 \oplus w_4 \oplus w_5 \oplus w_6 \text{ and}$$

$$Q = \sum_{k=1}^{6} T^{7-k} w_k =$$

$$T^6 w_1 \oplus T^5 w_2 \oplus T^4 w_3 \oplus T^3 w_4 \oplus T^2 w_5 \oplus T w_6.$$

Here, the symbol $\oplus$ signifies the modulo 2 summing or exclusive OR operation for the corresponding bits of the six individual words, and T signifies a 14-by-14-bit matrix called an auxiliary matrix. When it is detected that errors are contained in words $w_i$ and $w_j$ in one data block $w_1$–$w_6$, $w_i$ and $w_j$ are obtained from two-unknown, first-order simultaneous equations $$w_j = (T^{i-j} \oplus I)^{-1}(T^{i-7} SQ \oplus SP)$$

and $$w_i = SP \oplus w_j$$

where I is the unit matrix of a 14-by-14-bit configuration, i and j are integers satisfying a condition $1 \leq i \leq j \leq 6$, and $$SP = w_1 \oplus w_2 \oplus \ldots \oplus w_6 \oplus P$$

and $$SQ = T^6 w_1 \oplus T^5 w_2 \ldots \oplus T w_6 \oplus Q$$

The hardware for the correction operation is thus constructed with circuits for generation of SP, generation of SQ, $T^n$ multiplication operation and matrix multiplication by $(T^{i-j} \oplus I)^{-1}$. Such a circuitry itself, however, is irrelevant to the subject matter of the invention, and it will be described hereinafter only briefly with reference to the drawings.

Figure 2:
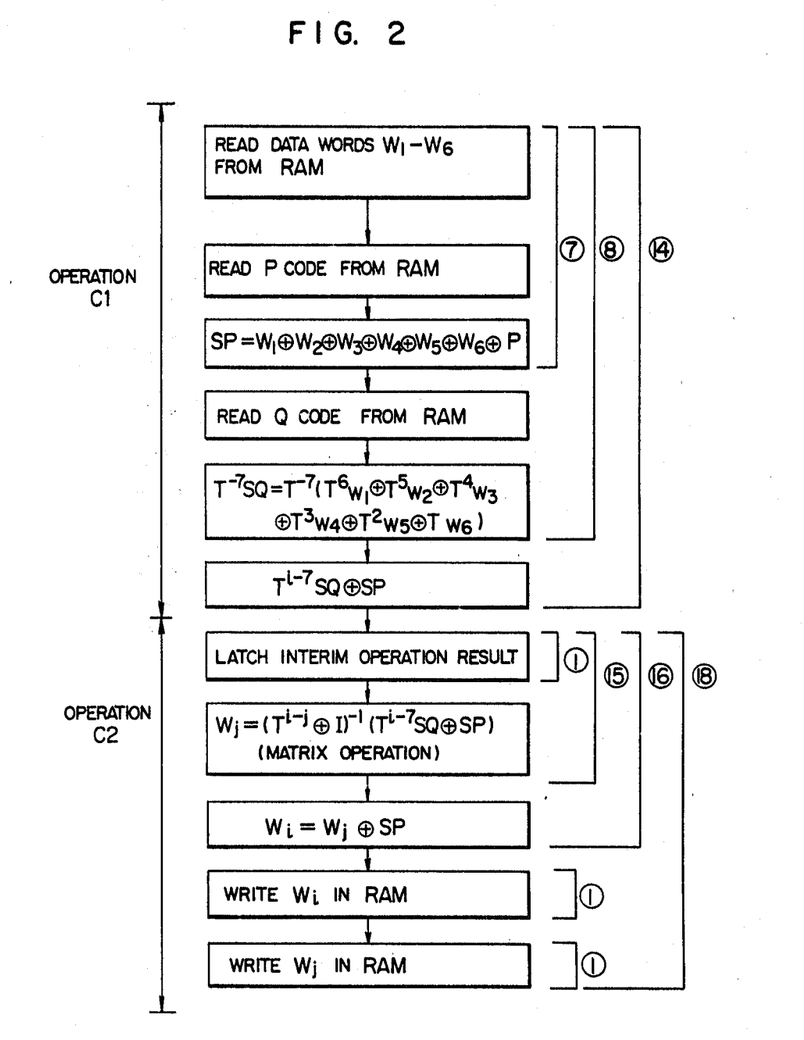
FIG. 2 is a flow chart of an operation routine necessary for correcting data errors produced in the PCM recorder of FIG. 1.

FIG. 2 shows a flow chart of the error correction operation performed in the error correction circuit in FIG. 1. Where the operation from the reading of data words till the writing of the error correction result is carried out in one horizontal sync period, it is likely to occur that the correction operation is not completely performed due to reduction of the horizontal sync period caused by jitter in the VTR. Accordingly, it has been proposed to carry out the correction operation as separate operations during a time period longer than one horizontal sync period as described in, for instance, Japanese Pat. application No. 132869/1980 (filed on Sept. 26, 1980). As an example, the correction operation is carried out as separate operations C1 and C2 as shown in the flow chart of FIG. 2. These operations are carried out in consecutive horizontal sync periods. The results of the operation C1 is latched, and the operation C2 is carried out in the next horizontal sync period. The operation C1 is started after the latching of the result of the operation C1.

If the horizontal sync period is reduced and ended, due to the effect of jitter, before the completion of the operation C1 so that the operation C2 is started with the result of the operation C1 latched while the operation C1 is incomplete, erroneous correction is made with erroneous latched data. The result of the erroneous correction of the error data is written in the RAM or the storage device and is provided as the output signal. Since the error correction is carried out by using the Q code, the erroneously corrected data is likely to appear as audio data over the entire amplitude range and, when provided as the output signal to the D-A converter, will cause abnormal sound.

Figure 3:
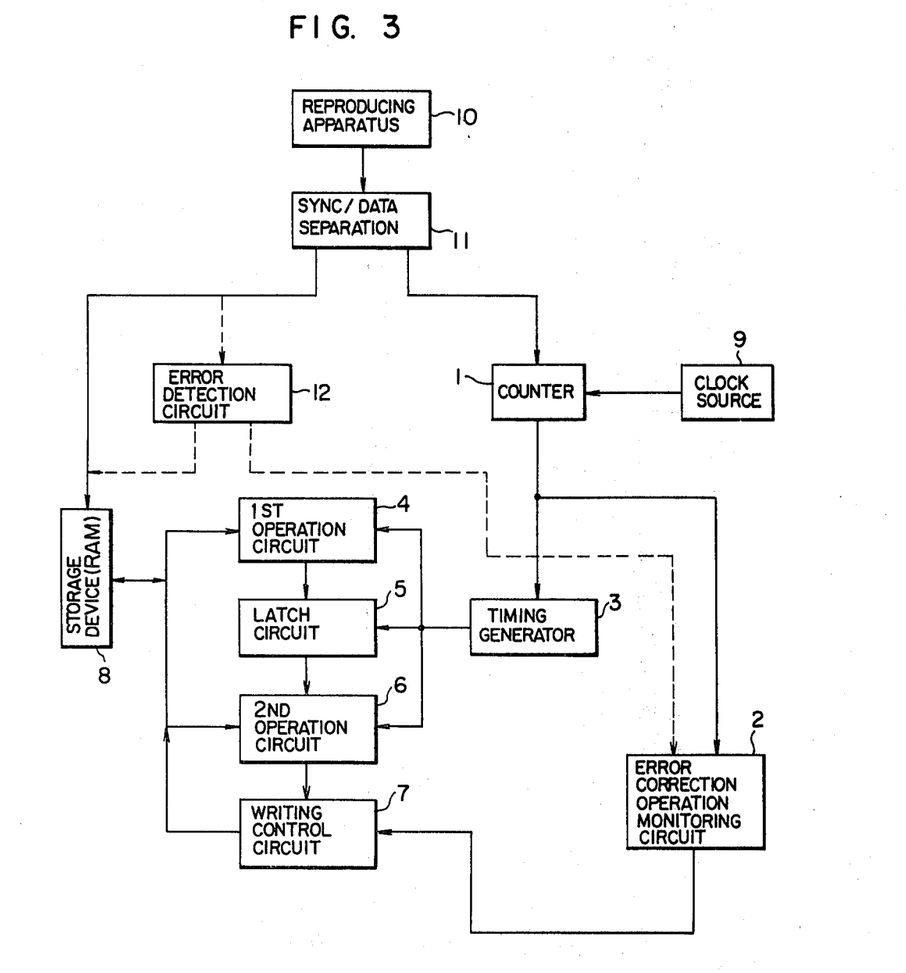
FIG. 3 is a block diagram showing an embodiment of the invention.

FIG. 3 is a block diagram showing an embodiment of the invention. The operation of this embodiment is described hereinunder in connection with FIGS. 1 and 2, but the system, through which the information signal passes, it not limited to the VTR. In general, the signal which can be processed by the error correction circuit according to the invention, may be any digital information signal having passed through a system, which causes information errors and time-base variations.

Referring to FIG. 3, reference numeral 10 designates a reproducing system, which may be the VTR shown in FIG. 1. The digital information signal reproduced in the reproducing system 10, usually has a plurality of digital information signal trains respectively containing digital information data and error correction data and recurrent sync pulses inserted between adjacent signal trains. The digital information data in the information signal contains errors due to dropouts as mentioned earlier and also has been subjected to the influence of time-base variations in passing through the system 10. This information signal is coupled through a sync/data separation circuit 11, and a sync signal or a signal generated in synchronism therewith are fed to a counter 1 as a correction operation start signal. A clock pulse signal at a predetermined repetition frequency is supplied from a clock source 9 to the counter 1. When it receives a correction operation start signal, the counter 1 starts to count clock pulses from the clock source 9, and continues counting immediately before the impression of the next sync signal or a correction operation start signal generated in synchronism therewith. With the impression of the start signal, it is reset and starts the counting of clock pulses afresh from zero. The output of the counter 1 is fed to a timing generator 3, which generates a timing signal according to the output of the counter 1.

The information signal provided from the sync/data separation circuit 11, now free from the sync signal, is fed to a storage device 8 and stored in a first storage section therein. An error detection circuit 12 is effective to the invention in case where errors are contained in two words among the digital information words (for instance 6 words each of 14 bits) in a digital signal train, and it serves to detect the number of errors, for instance, by setting an error flag with respect to digital information where an error word is present. Where the circuit 12 is provided, digital information signal inclusive of the error number data is stored. A first operation circuit 4, a latch circuit 5 and a second operation circuit 6 are timed with the timing signal supplied from the timing generator 3. These circuits serve to read out the information signal containing error, stored in the first storage section of the storage device (RAM) 8, latch the previous operation results in the latch circuit 5, effect the remaining operation on the basis of the latched operation results and store the final results in a second storage section of the storage device 8. The writing of the final operation results is controlled by a writing control section 7. An error correction operation monitoring circuit 2 receives the output from the counter 1 and also the output from the error detection circuit 12 (if this circuit is employed), and its output is supplied to the writing control circuit 7. The error correction operation monitoring circuit 2 has a function of monitoring the number of operation steps executed in one sync signal period by making use of the output of the counter 1, i.e., a function of monitoring the extent of progress of operation or the degree of execution of operation steps. The second operation circuit 6 performs operation with the operation results from the first operation circuit 4.

In FIG. 2, the number given on the right-hand side of the individual operation routines indicate the number of steps involved in the execution of the routines, i.e., they correspond to the numbers of timing pulses supplied from the timing generator 3 shown in FIG. 3. The content of the operation procedure shown in FIG. 2 and the step numbers involved are thus subject to changes whenever measures involved in the method of error correction such as error correction data are changed or modified. The operation of the embodiment will now be described with reference to FIGS. 2 through 4.

The operation C1 includes 14 steps, while the operation C2 includes 18 steps. The counter 1 is a circuit, which is cleared by an error correction operation start signal and counts 18 steps, and the error correction operation is performed with the timing of the output of the counter 1 and in the manner as shown in FIG. 2. Where the operations C1 and C2 are separately performed in the respective two sync signal periods, these operations C1 and C2 can proceed concurrently with respect to respective two adjacent data blocks. The operation C1 is completed with the completion of the 14-th step from the appearance of the error correction operation start signal, while the operation C2 is completed with the completion of the 18-th step. When only a single error is contained and can be corrected with the sole P code by making use of the error detection code, it is only necessary for the correction to perform or execute 1-7 steps of the operation C1 to generate SP in one sync signal period. (In this case, all the error data have been stored as "0" in the RAM.)

If the sync signal period $T_h$, i.e., the recurrence period of the correction operation start signals, is contracted due to the effect of jitter or the like, the writing of the operation results of the correction operation circuitry 4 to 6 in the second storage section of the storage device 8 is controlled through the control circuit 7 in dependence upon the extent of contraction in the manner as described hereinafter.

Figure 4:
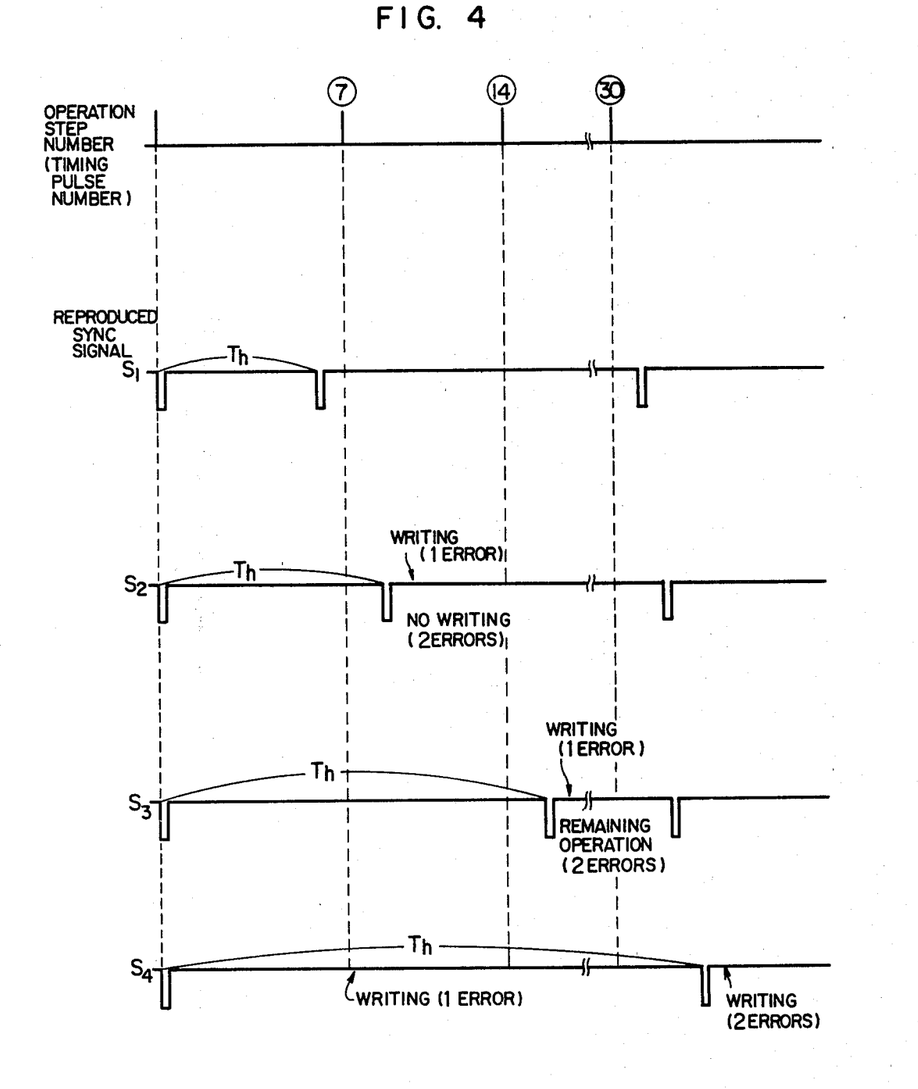
FIG. 4 is a view useful to explain the operation of the embodiment of FIG. 3.

With reproduced sync signal as shown at $S_1$ in FIG. 4 (with the sync signal period $T_h$ being shorter than time period for 7 steps), the monitoring circuit 2 detects that the output of the counter 1, i.e., the number of operation steps executed by, for example, the first operation circuit 4, is less than 7. In this case, the error correction is impossible irrespective of whether one data block contains only one error word or two or more error words, so that the writing of the operation results in the storage device 8 under the control of the writing control circuit 7 is inhibited. With a reproduced sync signal shown at $S_2$ in FIG. 4 (with the period $T_h$ being equal to or longer than time period for 7 steps and shorter than time period for 14 steps), the monitoring circuit 2 detects that the number of operation steps executed by, for example, the first operation circuit 4 during the period $T_h$ is equal to or greater than 7 and less than 14. In this case, if one data block contains only a single error word, the writing of the correct data of $w_i$ for the error data in the storage device 8 in a proper timing is allowed. If one data block contains two or more error words, the correction is impossible, so that the writing is inhibited as in the case of the signal $S_2$. With a reproduced sync signal as shown at $S_3$ in FIG. 4 (with the signal period $T_h$ being equal to or longer than time period for 14 steps and shorter than time period for 30 steps), it is detected that the number of operation steps executed by, for example, the first operation circuit 4 during the period $T_h$ is equal to or greater than time period for 14 steps and less than time period for 30 steps. In this case, if one data block contains only a single error word, the writing of the correct data of $w_i$ for the error word in the storage device 8 in a proper timing is allowed. If one block data contains two error words, error correction using error correction words P and Q is possible since the number of operation steps executed is equal to or greater than 14. If this is the case, the operation results so far are latched in the latch circuit 5, the remaining operation is performed in, for example, the second operation circuit 6 from the instant of start of the next sync signal period, and the writing of the correct data of $w_i$ and $w_j$ for the error words which are the final results of operation in the storage device 8 is allowed. With a reproduced sync signal as shown at $S_4$ in FIG. 4 (with the period $T_h$ being longer than or equal to time period for 30 steps), it is detected that all the operation steps have been executed in, for example, the first operation circuit 4, so that the writing of the correct data of $w_i$ for the one error word or of $w_i$ and $w_j$ for the two error words in a proper timing is allowed. It is to be understood that the first operation circuit 4 executes only the steps that can be executed within a first sync signal period $T_h$ among the operation steps shown in FIG. 2. The results of operation are latched in the second operation circuit 6, and the remaining operation steps are executed in the second operation circuit 6 during the second sync signal period (following the first).

The above control has an effect of preventing the writing of erroneous error correction data in the storage device 8 that might otherwise result from the lack of execution of the correction operation steps. In case writing of corrected data in the storage device 8 is not effected due to the lack of the execution of the correction operation steps, concealment of the reproduced, read-out output from the storage device 8 is effected by previous value holding or interpolation or substituting an average value of the preceding and succeeding data using a flag set in the RAM 8 in accordance with the result of error detection before the execution of the correction operation. This prevents the generation of abnormal sound due to the output of erroneous correction data. In the actual playback, the cases of correcting a single error word are overwhelmingly frequent compared to the cases where the correction of two error words is necessary. According to the instant embodiment, stronger protection is given to the case of correcting a single error word than to the case of correcting two error words with respect to the reduction of the operation period. Thus, the operation results are not unnecessarily left unused.

In the PCM signal recording and reproducing system in which analog audio signals are recorded and reproduced as digital signals, the generation of click noise is very detestable. Click noise may result from the erroneous correction of error data. With the instant embodiment, the probability of erroneous correction can be greatly reduced. Thus, steady and high quality sound reproduction can be obtainable even with a VTR, in which the tape has an unsatisfactory magnetic surface or the rotational drive mechanism is imperfect.

Figure 5:
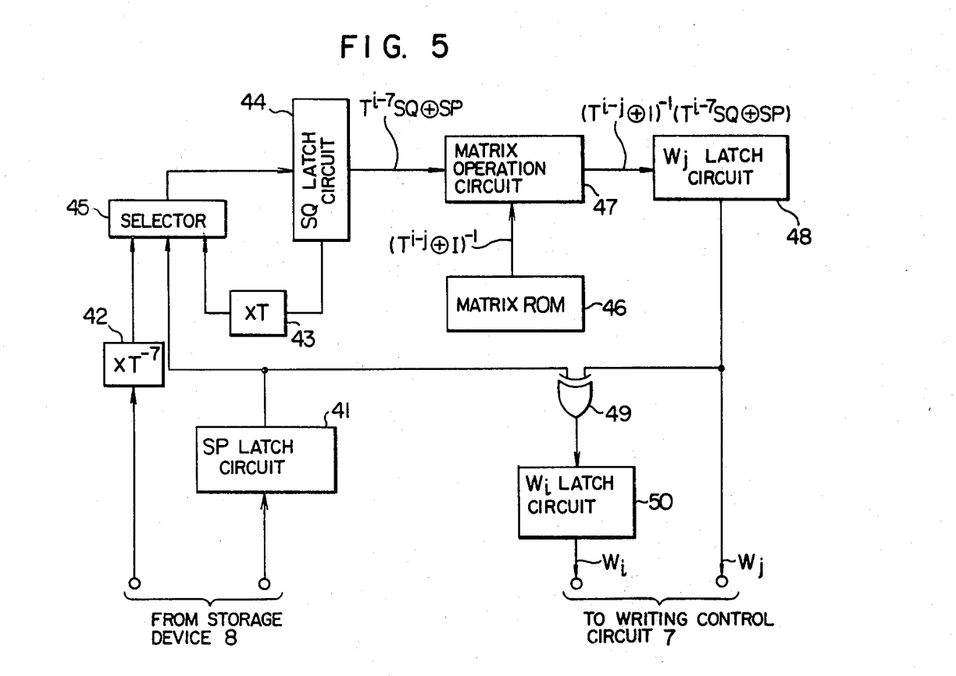
FIG. 5 is a block diagram showing an example of an operation circuit in the embodiment of FIG. 3.

FIG. 5 shows an example of a construction and arrangement of the first operation circuit 4, latch circuit 5 and second operation circuit 6 shown in FIG. 3. This circuit effects the operation of correcting errors occurring in the PCM recorder of FIG. 1 according to the error correction operation program shown in FIG. 2. The construction is thus irrelevant to the subject matter of the invention, and it will be described only briefly.

An SP latch circuit 41 is constituted by, for instance, 14 unit circuits each including a two-input exclusive OR gate and a latch circuit connected to the output of the gate. In each unit circuit, a data word bit of the information signal read out from the storage device 8 is coupled to one of the input terminals of the gate, and the output of the latch circuit is coupled to the other gate input terminal. With this construction, $SP = w_1 \oplus w_2 \oplus \ldots w_6 \oplus P$ is calculated and latched in the SP latch circuit 41. A $T^{-7}$-multiplication circuit 42, which receives the data word bits from the storage device 8, cooperates with a T-multiplication circuit 43 and SQ latch circuit 44 to cause an SQ latch circuit 44 to generate $T^{i-7}SP \oplus SQ$. The SQ latch circuit 44 includes unit circuits each having a two-input exclusive OR gate and a latch circuit connected to the output of the gate. The output of the latch circuit is coupled to the T-multiplication circuit 43. One input terminal of the gate is connected with the output of the $T^{-7}$-multiplication circuit 42 while the other input terminal of the gate is connected with the output of the T-multiplication circuit 43 in each unit circuit though not shown in detail. The outputs of the $T^{-7}$ and T multiplication circuits 42 and 43 and of the SP latch circuit 41 are selectively supplied to the SO latch circuit 44 through a selector 45, thereby generating the above-mentioned $T^{i-7}SQ \oplus SP$. A matrix ROM 46 has a 14-by-14-bit construction generates $(T^{-j} \oplus I)^{-1}$. A matrix operation circuit 47 generates the product of the outputs of the circuits 44 and 46 $(T^{i-j} \oplus I)^{-1}(T^{i-7}SP \oplus SQ) = w_i$, and the product is latched in a $w_j$ latch circuit 48. The outputs of the latch circuit 48 and SP latch circuit 41 are coupled to a two-input exclusive OR gate 49 to calculate $w_i = w_j + SP$, and the result is latched in a $w_i$ latch circuit 50. The outputs of the $w_j$ and $w_i$ latch circuits 48 and 50 are supplied to the writing control circuit 7.

Figure 6:
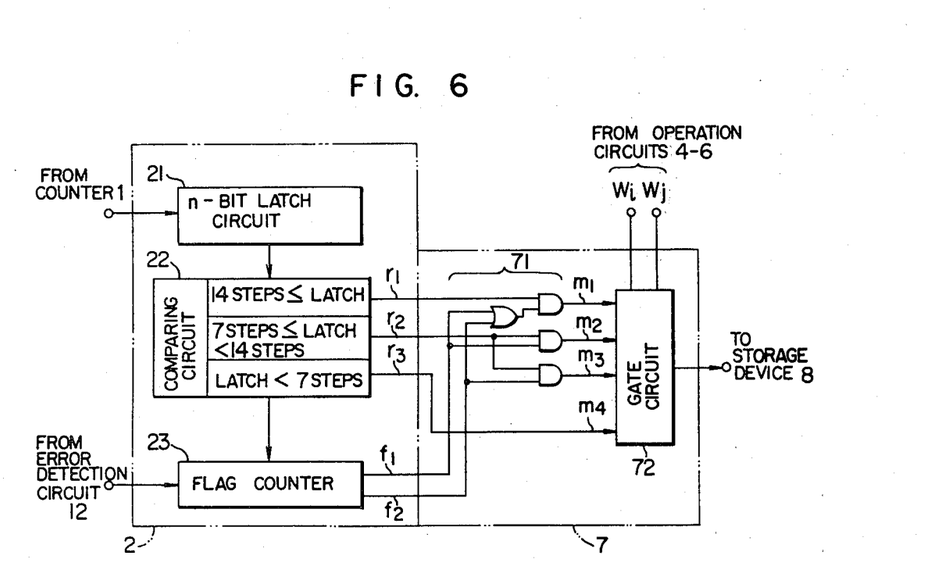
FIG. 6 is a block diagram showing an example of an error correction operation monitoring circuit and a writing control circuit that may be used for the embodiment of FIG. 3.

FIG. 6 shows an example of a construction and arrangement of the error correction operation monitoring circuit 2 and writing control circuit 7.

The monitoring circuit 2 includes an n-bit latch circuit 21 receiving the output of the counter 1, a comparing circuit 22 for comparing the output of the n-bit latch circuit 21 with reference values representing a plurality of critical steps required in the error correction operation (last steps in such operations of a minimum number of steps necessary for the correction of a single error word or two error words such as the 7-th step or 14-th step in FIG. 2), and a flag counter 23 for counting an error flag signals supplied from the error correction circuit 12. The n-bit latch circuit 21 latches the count value of the counter 1 immediately before the counter 1 is reset by each sync pulse. The comparing circuit 22 includes means for generating a signal $r_1$ which is "1" when the output of the n-bit latch circuit 21 is less than the reference value representing the seventh step, means for generating a signal $r_2$ which is "1" when the latch circuit output is equal to or greater than the reference value for the seventh step and less than a reference value for the 14-th step, and means for generating a signal $r_3$ which is "1" when the latch circuit output is equal to or greater than the reference value for the 14-th step. The flag counter 23 generates a signal $f_1$ which is "1" when one digital data block contains only a single error word and a signal $f_2$ which is "1" when one digital data block contains two error words.

The writing control circuit 7 includes a logic circuit 71 which receives the outputs $r_1$, $r_2$ and $r_3$ of the comparing circuit 22 in the monitoring circuit 2 and the outputs $f_1$ and $f_2$ of the flag counter 23, and a gate circuit 72 which receives the outputs $m_1$, $m_2$ and $m_3$ of the logic circuit 71. To the gate circuit 72 are also supplied the outputs $w_i$ and $w_j$ of the operation circuit such as shown in FIG. 5. The logic circuit 71 includes a two-input OR gate receiving the outputs $f_1$ and $f_2$ of the flag counter 23, a two-input AND gate receiving the output $r_1$ of the comparing circuit 22 and the output of the OR gate and generating a control signal $m_1$ for allowing the writing of $w_i$ and $w_j$, a two-input AND gate receiving the output $r_2$ of the comparing circuit 22 and output $f_1$ of the flag counter 23 and generating a control signal $m_2$ allowing the writing of $w_i$, a two-input AND gate receiving the output $r_2$ of the comparing circuit 22 and output $f_2$ of the flag counter 23 and generating a control signal $m_3$ for inhibiting the writing, and means for providing the output $r_3$ of the comparing circuit 22 as a writing inhibition control signal $m_4$. A gate circuit 72 receives the control signals $m_1$ to $m_4$ from the logic circuit 71 and controls the writing into the storage device (RAM) 8 by gating the signals $w_i$ and $w_j$ from the operation circuit shown in FIG. 5 according to the received control signals.

We claim:

1. A circuit for correcting errors in an information signal having been subjected to a time-base variation as well as the errors due to passage of said information signal through a system, said information signal including a plurality of digital signal trains each having digital information data and error correction data with recurrent sync pulses interposed between adjacent two signal trains, the correcting circuit comprising:
- a source of clock pulses;
- means for generating a correction operation start signal in response to each of said sync pulses;
- a counter arranged to count the clock pulses from said source during a time period between successive two correction operation start signals from said start signal generating means;
- storage means including a first storage section serving to store said information signal and a second storage section;
- a correction operation circuit arranged to be supplied with said information signal from said first storage section and having means for performing a plurality of operation steps for correcting the errors in said information signal with said error correction data, the results of said operation steps being stored in said second storage section;
- means responsive to the output of said counter for generating an operation timing signal to be supplied to said correction operation circuit so that the performance of said plurality of operation steps are timed with said operation timing signal;
- means responsive to the output of said counter for monitoring the degree of execution of operation steps in said correction operation circuit; and
- means responsive to the output of said monitoring means for controlling writing of said operation results in said second storage section.

2. A circuit according to claim 1, further comprising an error detection circuit for detecting the number of errors in the digital information data in each digital signal trains, the output of said error detection circuit being supplied to said monitoring means.

3. A circuit according to claim 1, in which said correction operation circuit includes:
- a first circuit portion serving to perform correction operation steps for determining correcting data corresponding to one word in one of said digital data signal trains and correction operation steps for obtaining operation results necessary for determining corrected data corresponding to two words in the digital information data in said one digital signal train, one of said two words being said one word; and
- a second circuit portion serving to perform correction operation steps further necessary for determining corrected data corresponding to said two words.

* * * * *